(12) United States Patent
Bratkovski et al.

(10) Patent No.: US 8,143,682 B2
(45) Date of Patent: Mar. 27, 2012

(54) METHODS AND SYSTEMS FOR IMPLEMENTING LOGIC GATES WITH SPINTRONIC DEVICES LOCATED AT NANOWIRE CROSSBAR JUNCTIONS OF CROSSBAR ARRAYS

(75) Inventors: Alexandre M. Bratkovski, Mountain View, CA (US); Wei Wu, Palo Alto, CA (US); Gregory S. Snider, Mountain View, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1078 days.

(21) Appl. No.: 11/590,959

(22) Filed: Oct. 31, 2006

(65) Prior Publication Data
US 2008/0100345 A1    May 1, 2008

(51) Int. Cl.
*H01L 29/82* (2006.01)
(52) U.S. Cl. .................. 257/421; 257/E21.665
(58) Field of Classification Search .................. 257/758, 257/E27.004
See application file for complete search history.

(56) References Cited

U.S. PATENT DOCUMENTS

| | | | |
|---|---|---|---|
| 6,256,767 B1 * | 7/2001 | Kuekes et al. | 716/9 |
| 2002/0014667 A1 * | 2/2002 | Shin et al. | 257/368 |
| 2003/0104637 A1 * | 6/2003 | Aeppli et al. | 438/3 |
| 2004/0151012 A1 * | 8/2004 | Snider et al. | 365/49 |
| 2004/0164327 A1 * | 8/2004 | Shin et al. | 257/208 |
| 2004/0246631 A1 * | 12/2004 | Dieny et al. | 360/324.1 |
| 2004/0246776 A1 * | 12/2004 | Covington | 365/173 |
| 2005/0052900 A1 * | 3/2005 | Den | 365/154 |
| 2005/0088876 A1 * | 4/2005 | Fulkerson et al. | 365/173 |
| 2005/0133254 A1 * | 6/2005 | Tsakalakos | 174/261 |
| 2006/0006334 A1 * | 1/2006 | Kadono et al. | 250/338.2 |
| 2006/0104110 A1 * | 5/2006 | Sun et al. | 365/173 |
| 2006/0120145 A1 * | 6/2006 | Ezaki et al. | 365/158 |
| 2006/0279981 A1 * | 12/2006 | Diao et al. | 365/158 |
| 2007/0101309 A1 * | 5/2007 | Wu et al. | 716/16 |
| 2007/0262301 A1 * | 11/2007 | Cowburn et al. | 257/40 |
| 2007/0272036 A1 * | 11/2007 | Reed | 73/862.331 |
| 2008/0001176 A1 * | 1/2008 | Gopalakrishnan et al. | 257/211 |

* cited by examiner

*Primary Examiner* — Kiesha Bryant
*Assistant Examiner* — Igwe U Anya

(57) ABSTRACT

Various method and system embodiments of the present invention are directed to implementing serial logic gates using nanowire-crossbar arrays with spintronic devices located at nanowire-crossbar junctions. In one embodiment of the present invention, a nanowire-crossbar array comprises a first nanowire and a number of substantially parallel control nanowires positioned so that each control nanowire overlaps the first nanowire. The nanowire-crossbar array includes a number of spintronic devices. Each spintronic device is configured to connect one of the control nanowires to the first nanowire and operate as a latch for controlling signal transmissions between the control nanowire and the first nanowire.

10 Claims, 10 Drawing Sheets

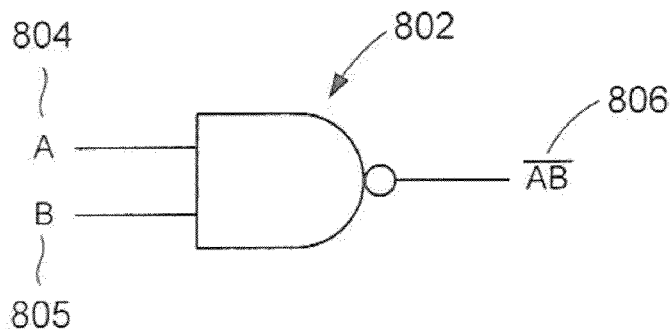
Figure 8A
| A | B | $\overline{AB}$ |
|---|---|---|
| 0 | 0 | 1 |
| 0 | 1 | 1 |
| 1 | 0 | 1 |
| 1 | 1 | 0 |
Figure 8B
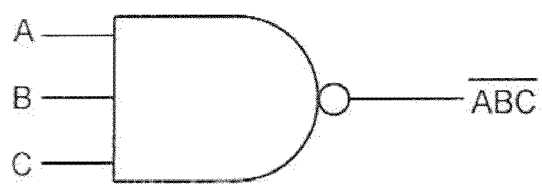
Figure 9A
| A | B | C | $\overline{ABC}$ |
|---|---|---|---|
| 0 | 0 | 0 | 1 |
| 0 | 0 | 1 | 1 |
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 0 |
Figure 9B

METHODS AND SYSTEMS FOR IMPLEMENTING LOGIC GATES WITH SPINTRONIC DEVICES LOCATED AT NANOWIRE CROSSBAR JUNCTIONS OF CROSSBAR ARRAYS

TECHNICAL FIELD

The present invention is related to nanoscale electronic devices, and, in particular, to logic gate implementations having spintronic devices located at nanowire crossbar junctions of crossbar arrays.

BACKGROUND

During the past fifty years, the electronics and computing industries have been relentlessly propelled forward by ever decreasing sizes of basic electronic components, such as transistors and signal wires, and by correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light, for example, far more technically demanding photolithographic methods may need to be employed. Expensive semiconductor fabrication facilities may need to be rebuilt in order to implement the photolithographic methods. Many new obstacles may be encountered. For example, semiconductor devices are photolithographically fabricated in a series of steps. The masks used in each step are precisely aligned with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor surfaces decrease, resulting in an increasing proportion of defective devices during manufacture, and a correspondingly lower yield of useful product. Ultimately, various quantum effects that arise only at molecular-scale distances may altogether overwhelm current approaches to semiconductor fabrication.

In view of these problems, researchers and developers have expended considerable research efforts in fabricating submicroscale and nanoscale electronic devices using alternative technologies. Nanoscale electronic devices generally employ nanoscale signal wires having widths, and nanoscale components having dimensions, of less than 100 nanometers. More densely fabricated nanoscale electronic devices may employ nanoscale signal wires having widths, and nanoscale components having dimensions, of less than 50 nanometers, or, in certain types of devices, less than 10 nanometers.

Although general nanowire technologies have been developed, it is not necessarily straightforward to employ nanowire technologies to miniaturize existing types of circuits and structures. While it may be possible to tediously construct miniaturized, nanowire circuits similar to the much larger, currently available circuits, it is impractical, and often impossible, to manufacture such miniaturized circuits using current technologies. Even were such straightforwardly miniaturized circuits able to be feasibly manufactured, the much higher component densities that ensue from combining together nanoscale components necessitate much different strategies related to removing waste heat produced by the circuits. In addition, the electronic properties of substances may change dramatically at nanoscale dimensions, so that different types of approaches and substances may need to be employed for fabricating even relatively simple, well-known circuits and subsystems at nanoscale dimensions. For example, the electronic properties of certain microscale electrical components, such as diodes or field-effect transistors, that can be used to fabricate microscale logic gates may not be obtainable at nanoscale dimensions. Thus, designers, manufacturers, and users of logic circuits have recognized the need for new nanoscale electronic components that can be used to fabricate electronic-based logic gates.

SUMMARY

Various method and system embodiments of the present invention are directed to implementing serial logic gates using nanowire-crossbar arrays with spintronic devices located at nanowire-crossbar junctions. In one embodiment of the present invention, a nanowire-crossbar array comprises a first nanowire and a number of substantially parallel control nanowires positioned so that each control nanowire overlaps the first nanowire. The nanowire-crossbar array includes a number of spintronic devices. Each spintronic device is configured to connect one of the control nanowires to the first nanowire and operate as a latch for controlling signal transmissions between the control nanowire and the first nanowire.

BREIF DESCRIPTION OF THE DRAWINGS

FIG. 8A shows a schematic representation of a NAND logic gate for two logic inputs.

FIG. 8B illustrates a truth table that represents possible logic inputs and corresponding logic outputs for the NAND logic gate shown in FIG. 8A.

FIG. 9A shows a schematic representation of a NAND logic gate for three logic inputs.

FIG. 9B illustrates a truth table that represents possible logic inputs and corresponding logic outputs for the NAND logic gate shown in FIG. 9A.

DETAILED DESCRIPTION OF THE INVENTION

Various method and system embodiments of the present invention are directed to implementing serial logic gates using nanowire-crossbar arrays with spintronic devices located at nanowire-crossbar junctions. A spintronic device, also called a "spin-based electronic device," is characterized by .the quantum mechanical intrinsic spin states of the spintronic-device electrons. An electron has two spin states that can be observed experimentally with respect to a particular direction as two detectable, magnetic energy states that are characterized as either "spin up" or "spin down." Because of these two spin states, spintronic devices exhibit magnetic moments, which can be variably controlled so that nanowire-crossbar junctions can be operated as non-volatile, bistable resistors.

Figure 1:
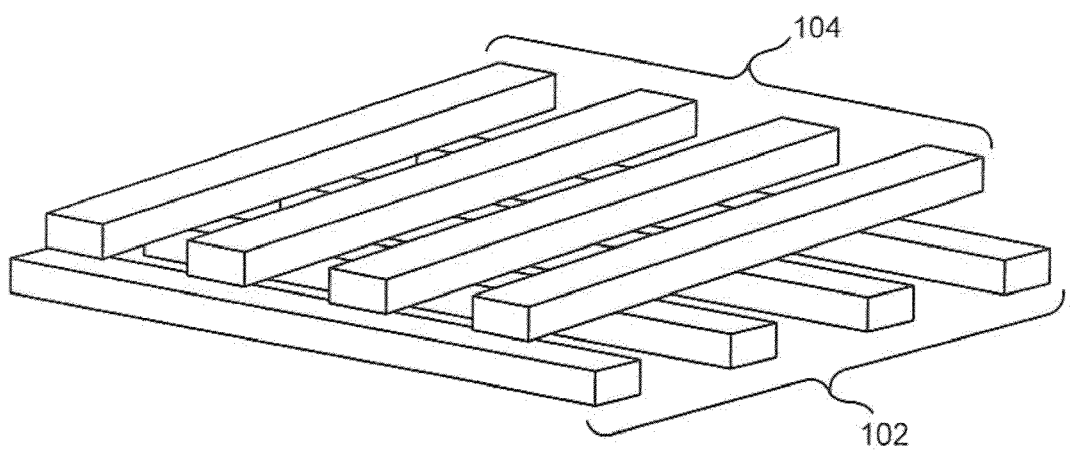
FIG. 1 illustrates a nanowire crossbar array.

FIG. 1 illustrates a nanowire crossbar array. In FIG. 1, a first layer of approximately parallel nanowires 102 is overlain by a second layer of approximately parallel nanowires 104. The second layer 104 is substantially perpendicular, in orientation, to the nanowires of the first layer 102, although the orientation angle between the layers may vary. The nanowires 102 can represent word wires and the nanowires 104 can represent bit wires. The two layers of nanowires form a lattice, or crossbar, each nanowire of the second layer 104 overlying all of the nanowires of the first layer 102 and coming into close contact with each nanowire of the first layer 102 at nanowire intersections that represent the closest contact between two nanowires. Although individual nanowires in FIG. 1 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires.

Nanowire layers can be fabricated by mechanical nanoimprinting techniques. Alternatively, nanowires can be chemically synthesized and can be deposited as layers of approximately parallel nanowires in one or more process steps, including Langmuir-Blodgett processes. Other alternative techniques for fabricating nanowires may also be employed. Thus, a two-layer nanowire crossbar comprising first and second layers, as shown in FIG. 1, can be manufactured by any of numerous relatively straightforward processes. Many different types of conductive and semi-conductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits.

Figure 2A:
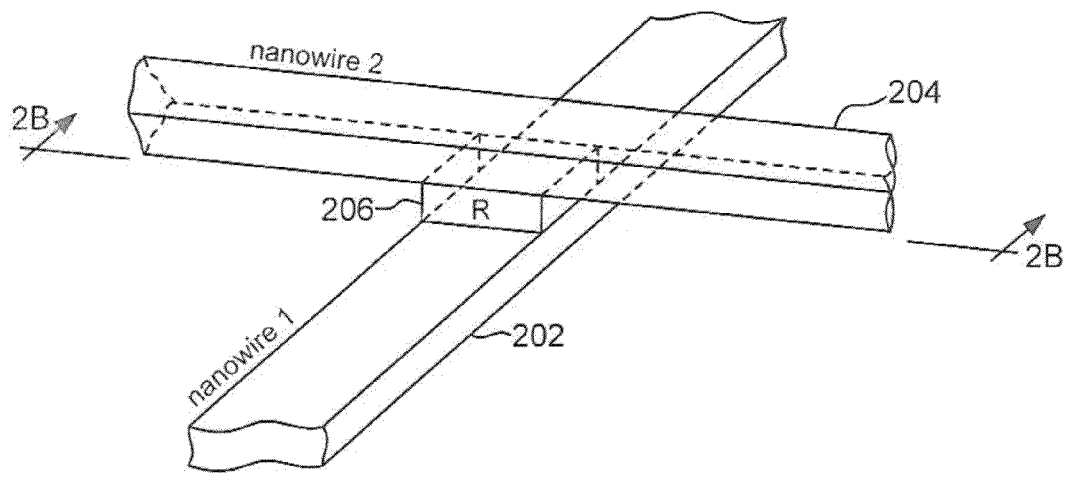
FIG. 2A illustrates of a crossbar junction that interconnects nanowires of two contiguous layers within a nanowire crossbar that represents an embodiment of the present invention.

At nanowire intersections, nanoscale spintronic devices can be fabricated to interconnect two overlapping nanowires. A nanowire intersection connected by a spintronic device is called a "crossbar junction." FIG. 2A illustrates of a crossbar junction that interconnects nanowires 202 and 204 of two contiguous layers within a nanowire crossbar that represents an embodiment of the present invention. The crossbar junction may or may not involve physical contact between the two nanowires 202 and 204. As shown in FIG. 2A, the two nanowires are not in physical contact at their overlap point, but the gap between the nanowires 202 and 204 is spanned by a spintronic device 206 that lies between the two nanowires at their closest overlap point.

Figure 2B:
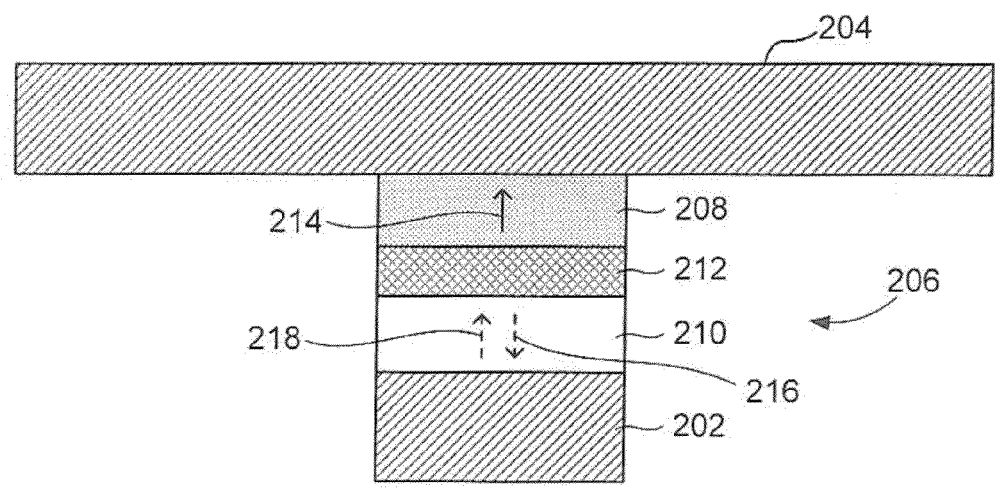
FIG. 2B illustrates a cross-sectional view of the crossbar junction shown in FIG. 2A that represents an embodiment of the present invention.

The spintronic device 206 can represent a spin valve. FIG. 2B illustrates a cross-sectional view of the two nanowires 202 and 204 and the spintronic device 206 that represents an embodiment of the present invention. The spintronic device 206 represents a spin valve comprising a permanent magnetic layer 208 and a free magnetic layer 210 separated by a spacer layer 212. The permanent magnetic layer 208 comprises a ferromagnetic material having electron spins that are aligned and fixed in substantially the same direction. As a result, the magnetic moment of the permanent magnetic layer 208 has fixed direction, as indicated by directional arrow 214. On the other hand, the free magnetic layer 210 comprises a "soft" ferromagnetic material. In other words, when the magnitude of an applied magnetic field is large enough, the electrons of the free magnetic layer 210 can switch spin states. As a result, the magnetic moment of the free magnetic material can be reversed, as represented by dashed-line directional arrows 216 and 218. The spacer layer can be composed of a non-metallic material, such as Cu, or an oxide in tunnel junction, such as $Al_2O_3$.

Note that there are a number of possible spintronic device orientations within a crossbar junction. For example, in embodiments of the present invention that employ the spin value shown in FIG. 2B, the magnetic layers 208 and 210 and the semiconductor layer 212 can be substantially parallel to the two upper and lower planes of nanowires so that an electric current flows between the nanowires 202 and 204 in a direction substantially perpendicular to the layers 208, 210, and 212. In alternate embodiments of the present invention, the magnetic layers 208 and 210 and the semiconductor layer 212 can be oriented substantially perpendicular to the overlapping nanowires 202 and 204 (not shown) so that an electric current flows between the nanowires 202 and 204 in a direction substantially parallel to the layers 208, 210, and 212.

The electronic properties of a spintronic-based crossbar junction depend on mutual orientation of the magnetic moments of the magnetic materials comprising the spintronic device, which is a result of the difference in electronic density of states at the Fermi level. When a spintronic device located a crossbar junction is composed of multiple metallic layers, the effect is called "giant magnetoresistance" ("GMR"). For GMR-based spintronic devices, the mutual orientation of the magnetic moments of the metallic layers may be switched by biasing the crossbar junction and running current through the metallic layers, which is called "spin-torque switching." When a spintronic device located a crossbar junction is composed of a metal-insulator-metal junction, the effect is called "tunnel magnetoresistance" ("TMR"). For TMR-based spintronic devices, one needs to produce a switching magnetic field by running current through word-bit wires or complementary cross-bar nanowires. In both GMR and TMR cases, the resistance state is stable and non-volatile.

Figure 2C:
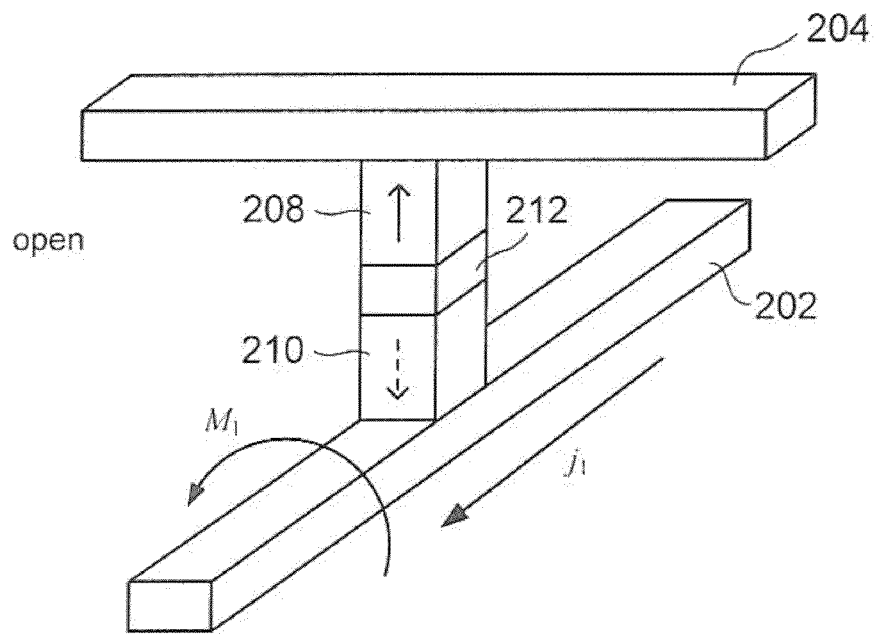
FIGS. 2C-2D illustrate changing the magnetic moment of a free magnetic layer of a spintronic device at a crossbar junction.
Figure 2D:
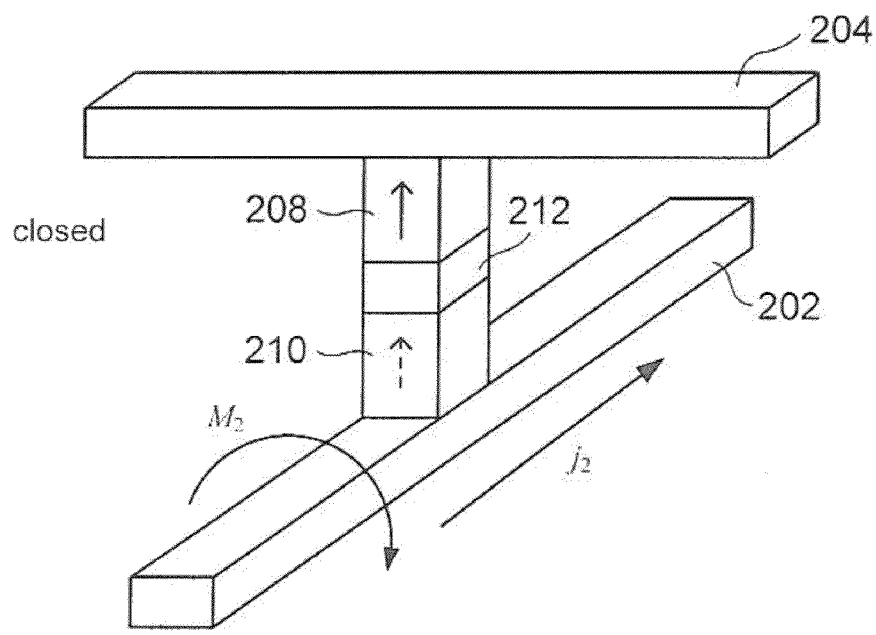

For spintronic-based junctions, the crossbar junction is biased, and the resulting current switches the orientation of the magnetic moment of the free layer by a spin-torque effect when the current density exceeds a minimum threshold value, such as current density in the range $10^7$-$10^9$ $A/cm^2$. FIGS. 2C-2D illustrate operating the spintronic device 206 as a spin valve using TMR. As shown in FIG. 2C, a voltage V applied to the nanowire 202 induces a current j, which, in turn, induces a magnetic field $M_1$. The magnetic field $M_1$ orients the magnetic moment of the free magnetic layer 210 into a direction that is substantially opposite the magnetic moment of the permanent magnetic layer 208. As a result, the spintronic device 206 is placed in a high-impedance state, which reduces the amount of current that can flow between the nanowires 202 and 204. On the other hand, as shown in FIG. 2D, a voltage −V applied to the nanowire 202 induces a current −j that flows in the opposite direction along the nanowire 202. The current −j induces a magnetic field $M_2$ that orients the magnetic moment of the free magnetic layer 210 into substantially the same direction as the magnetic moment of the permanent magnetic layer 208. As a result, the spintronic device 206 is placed in low-impedance state, which increases the amount of current that can flow between the nanowires 202 and 204.

Figure 3:
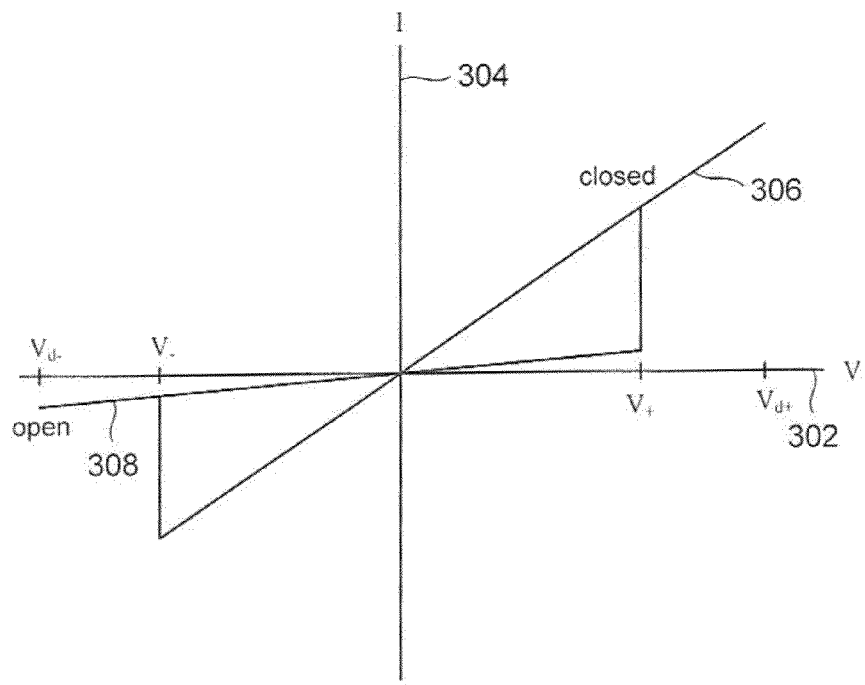
FIG. 3 shows current-versus-voltage curves that represents the operational characteristics of a spintronic device.

FIG. 3 shows current-versus-voltage curves that represents the operational characteristics of the spintronic device 206, shown in FIGS. 2C-2D. In FIG. 3, horizontal line 302 represents a voltage axis, and vertical line 304 represents a current axis. Curve 306 represents the low-impedance state of the spintronic device 206, and curve 308 represents the high-impedance state of the spintronic device 206. Voltages that fall within the voltage ranges $[V_+, V_{d+}]$ and $[V_{d-}, V_-]$ can be used to induce oppositely oriented magnetic fields that change the magnetic moment of the free magnetic layer 210, as described above with reference to FIGS. 2C-2D. For example, suppose the spintronic device 206 is initially in the low-impedance state represented by the curve 306. When a voltage V that falls within the voltage range $[V_+, V_{d+}]$ is applied across the spintronic device, the current j carried by the nanowire 202 induces the magnetic filed $M_1$, which flips the magnetic moment of the free magnetic layer 210 and causes the spintronic device 206 to transition to the high-impedance state represented by the curve 308. Now suppose the spintronic device 206 is in the high-impedance state represented by the curve 308. When a voltage −V within the voltage range $[V_{d-}, V_-]$ is applied to the spintronic device 206, the corresponding current −j carried by the nanowire 202 induces the magnetic filed $M_2$, which flips the magnetic moment of the free magnetic layer 210 and causes the spintronic device 206 to transition to the low-impedance state represented by the curve 306. The spintronic device 206 remains in either a high-impedance state or a low-impedance as long as the voltages across the spintronic device 206 remain in an operating voltage range $[V_-, V_+]$.

Latches

Figure 4:
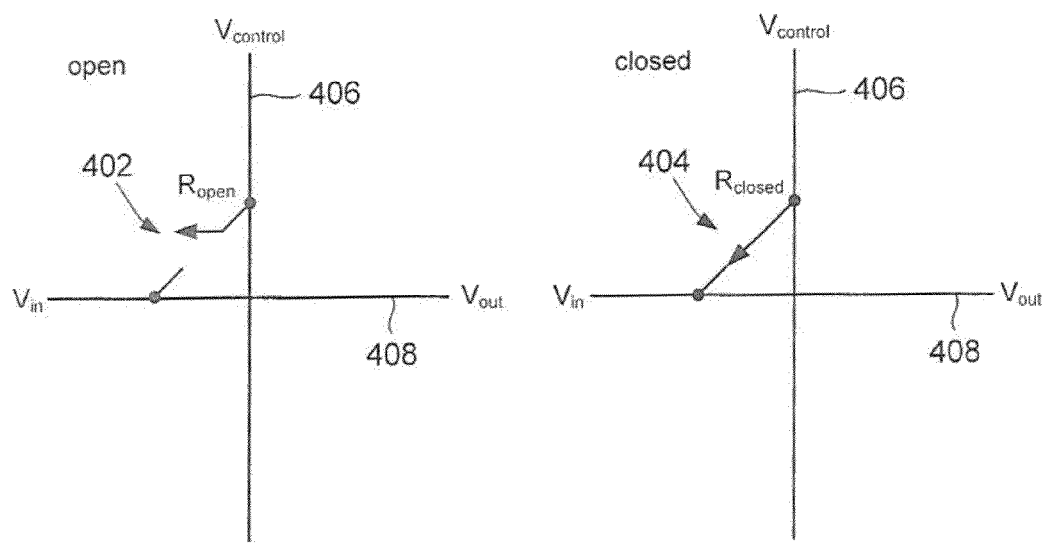
FIG. 4 illustrates schematic representations of an open latch and a closed latch that represents an embodiment of the present invention.

A spintronic device can be operated as a latch, which is normally in either a high-impedance state called "an open latch" or a low-impedance state called "a closed latch." FIG. 4 illustrates schematic representations of an open latch 402 and a closed latch 404, each representing an embodiment of the present invention. The latches 402 and 404 can represent either GMR-based spintronic devices or TMR-based spintronic devices. In FIG. 4, the open latch 402 represents a spintronic device in a high-impedance state $R_{open}$ located between overlapping nanowires 406 and 408, and the closed latch 404 represents the same spintronic device in a low-impedance state $R_{closed}$. In other words, the open latch 402 represents a spintronic device with the magnetic moment of the corresponding free magnetic layer aligned in a direction that is substantially opposite the magnetic moment of the permanent magnetic layer. The closed latch 404 represents a spintronic device with the magnetic moment of the corresponding free magnetic layer substantially aligned with the magnetic moment of the permanent magnetic layer. The open latch 402 and the closed latch 404 are used to represent spintronic devices at crossbar junctions in high and low-impedance states throughout the remaining figures.

A latch is a digital electronic component capable of storing a single bit of information. The bit is stored in the two impedance states of a single latch, which are used to represent the logic values "0" and "1." Note that is arbitrary whether a closed latch represents the logic value "0" or the logic value "1" and whether an open latch represents the logic value "1" or the logic value "0." A latch has an input nanowire, an output nanowire, and one or more control nanowire. For example, the spintronic-based latches 402 and 404 have an input nanowire corresponding to the nanowire 408, and a control nanowire corresponding to the nanowire 406. The nanowire 408 can also serve as an output nanowire. In general, the control nanowire can be used to place the latch into one of two different modes. The first mode is called a "programming mode" and the second is called an "output mode." When a latch is in the programming mode, the data encoded in a signal $V_{in}$ carried by the input nanowire is sampled, captured, and stored in the latch's memory element. When a latch is in the output mode, the data encoded in a signal $V_{out}$ is output onto the output nanowire, which can be accomplished using an inversion operation described below. In other words, a latch is a primitive storage device that can sample and save a logic signal and provide a mechanism for restoring the electrical integrity of the signal. For example, the nanowire 408 may be timeshared by both the input signal $V_{in}$ and the output signal $V_{out}$, and the control nanowire 406 may be used for both acquiring a logic value stored at the latch and for driving the latched data signal out as the output signal $V_{out}$ onto the nanowire 408.

A spintronic-based latch can be used in an inverting latch configuration, where a stored signal is the logic complement of an input signal, or a spintronic-based latch can be used in a non-inverting latch configuration. Different sequences of control voltages may be used for the two different latch configurations. For example, in alternate embodiments of the present invention, an input signal to a latch, called the "receiving latch," may be provided by a voltage source within a larger circuit as would be the case when the latch is interfaced to external complementary metal-oxide-semiconductor ("CMOS") circuitry, or the latch may be driven by the output signal of another latch called the "driving latch." When using a driving latch, the input signal can be represented by the impedance of the driving latch. This impedance is high, on the order of $R_{open}$, to represent a logic value "1," or low, on the order of a multiple of $R_{closed}$, to represent a logic value "0." The voltage source driving the input impedance $R_{in}$ can either be floating, ground, or a fixed positive voltage, depending on the state of the latch operation.

Figure 5A:
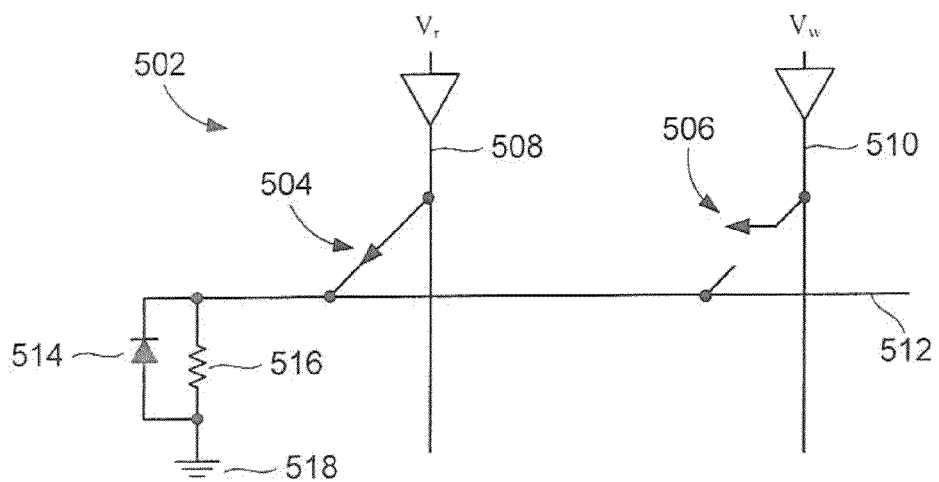
FIGS. 5A-5D illustrate operation of an inverting latch configuration that represents an embodiment of the present invention.
Figure 5B:
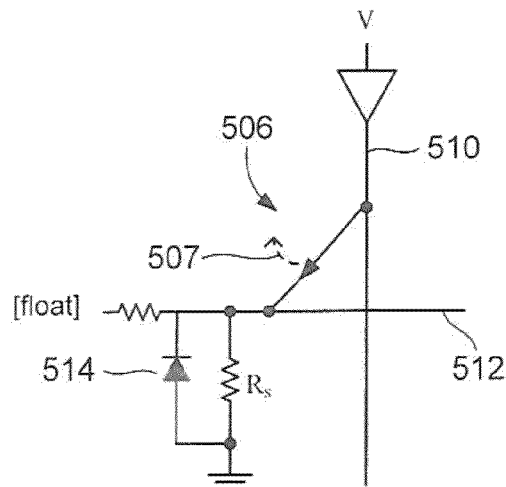
Figure 5C:
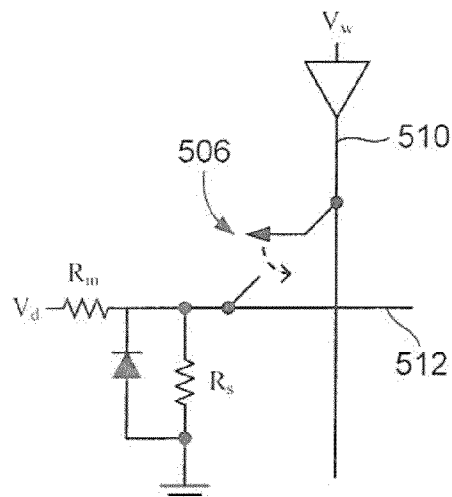
Figure 5D:
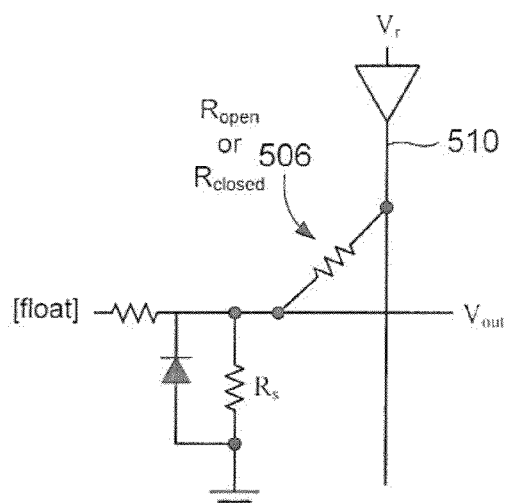

FIG. 5A illustrates an inverting latch configuration that represents an embodiment of the present invention. As shown in FIG. 5A, an inverting latch configuration 502 comprises a driving latch 504, a receiving latch 506, two control nanowires 508 and 510, a nanowire 512, a diode 514, a pull-down resistor $R_s$ 516, and a ground 518. Latch operation in an inverting latch configuration may be accomplished in three steps as describe with reference to FIGS. 5B-5D. FIGS. 5B-5D illustrate inverting the impedance state of the receiving latch 506 that represents an embodiment of the present invention. In FIG. 5B, the receiving latch 506 is changed from a closed state to an open state. This can be accomplished by applying a voltage V to the control nanowire 510. The voltage V is selected so that the direction of the associated current carried by the control nanowire 510 induces a magnetic field that flips the magnetic moment of the free magnetic layer of the spintronic device into an orientation that is substantially opposite the magnetic moment of the permanent magnetic layer of the spintronic device. In FIG. 5C, the receiving latch 506 is conditionally closed based on the state of the input signal. The nanowire 512 is driven with a fixed voltage $V_d$, and the control nanowire 510 is driven with a write voltage $V_w$. When the input signal $V_d$ corresponds to a logic value "1," the voltage $V_w$ is chosen so that the impedance state of the latch 506 corresponds to a logic value "0." When the input signal $V_d$ corresponds to a logic value "0," the voltage $V_w$ is chosen so that the impedance state of the latch 506 corresponds to a logic value "1." In FIG. 5D, the state of the receiving latch 506 may be read by disconnecting the input signal, which is accomplished by forcing the voltage source driver into a high-impedance state, and by driving the control nanowire 510 with a read voltage $V_r$.

Note that the diodes shown in FIG. 5A-5D are optional and may be included to provide a low-impedance path to prevent the voltage across the crossbar junction from destroying the crossbar junction when the spintronic device makes a transition to a different impedance state. Therefore, in alternate embodiments of the present invention described below, diodes, such as diode 514, are not included.

Figure 6:
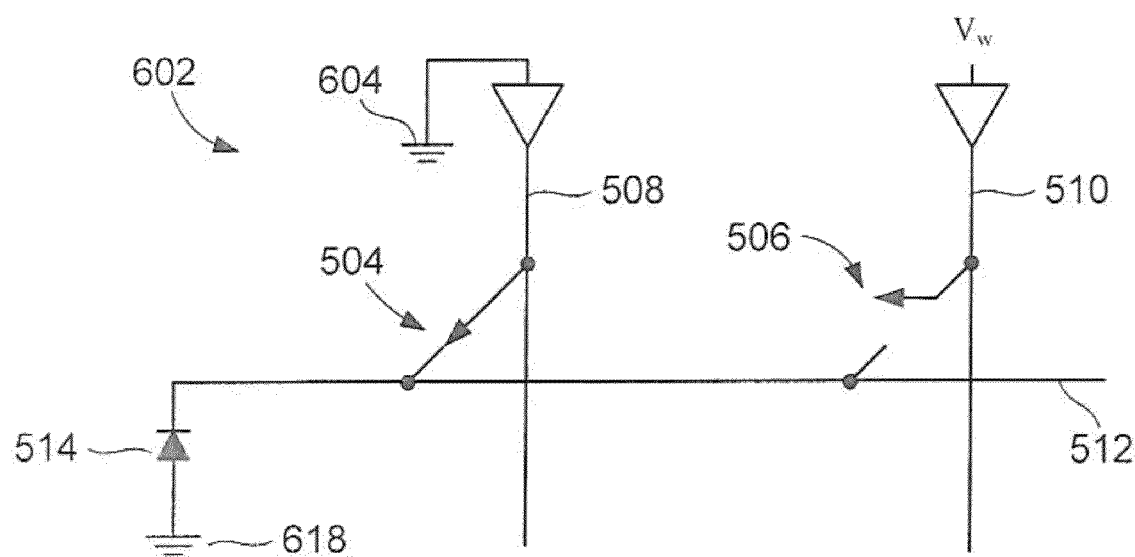
FIG. 6 illustrate a non-inverting latch configuration that represents an embodiment of the present invention.

FIG. 6 illustrates a non-inverting latch configuration 602 that represents an embodiment of the present invention. As shown in FIG. 6, the non-inverting latch configuration 602 eliminates the need for the pull-down resistor $R_s$ 516, as shown in FIG. 5A. As in the inverting latch configuration 502, the receiving latch 506 is opened, but closing the receiving latch 506 is accomplished by driving the control nanowire 508 of the driving latch with a ground 604 rather than a voltage $V_r$, and the control nanowire 510 of the receiving latch is driven with a write voltage $V_w$. As a result, the two crossbar junctions form of resistive voltage divider that will cause the receiving latch 506 to open only when the driving latch 504 is open, thus replicating the state of driving latch 504.

Serial Logic

The latch configurations described above serve as a foundation for fabricating serial logic nanowire crossbar systems that can be used to perform basic Boolean logic operations, such as AND, OR, and INVERT. The inverting latch configuration can be used to fabricate the NAND and NOR logic operations. The assignment of logic values "0" and "1" to a latch impedance state is entirely arbitrary. In the following discussion, an open latch represents a logic value "0," and a closed latch represents a logic value "1." Using this convention, the following four primitive operations can be can be used to implement NAND and NOR logic gates as well as a number of other logic gates. First, a "clear(latch)" represents an operation that unconditionally places the latch into the logic value "0" state. Second, a "conditionalSet(from latch, to latch)" represents an operation that places the to latch in the logic value "1" state when the from latch is in the logic value "0" state and the to latch remains unchanged when the from latch is in the logic value "1" state. Third, a "conditionalWrite (latch)" represents an operation that places the latch in the logic value "1" state, when the latch is initially in the logic value "0" state and the voltage on a shared horizontal nanowire is within a range necessary to close the latch. Fourth, a "read(latch)" represents an operation that supplies a voltage $V_r$ to the designated latch's control nanowire, forming a voltage divider between the latch and the pull-down resistor $R_s$, allowing the state of the latch to be determined by measuring the voltage on the horizontal nanowire.

Figure 7A:
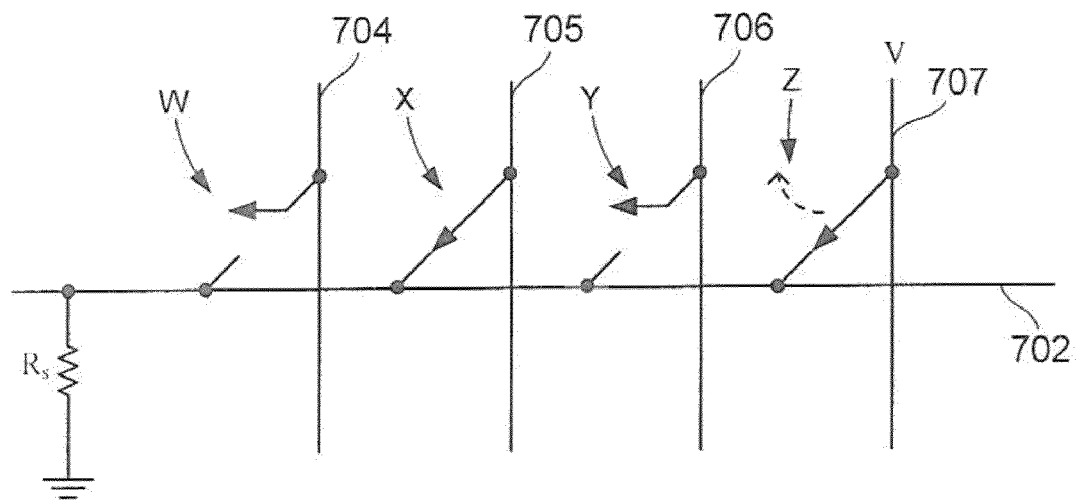
FIGS. 7A-7D illustrate four example implementations of four primitive latch operations that represents an embodiment of the present invention.
Figure 7B:
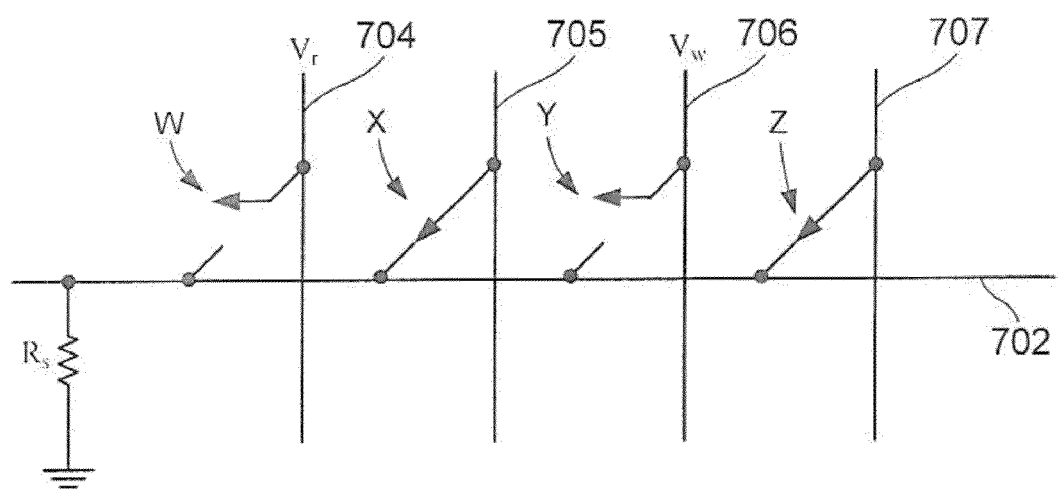
Figure 7C:
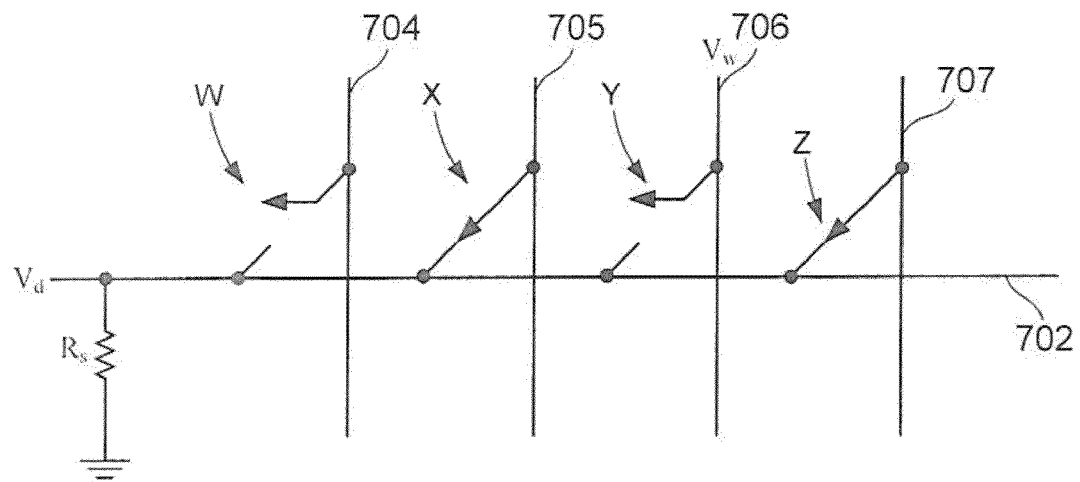
Figure 7D:
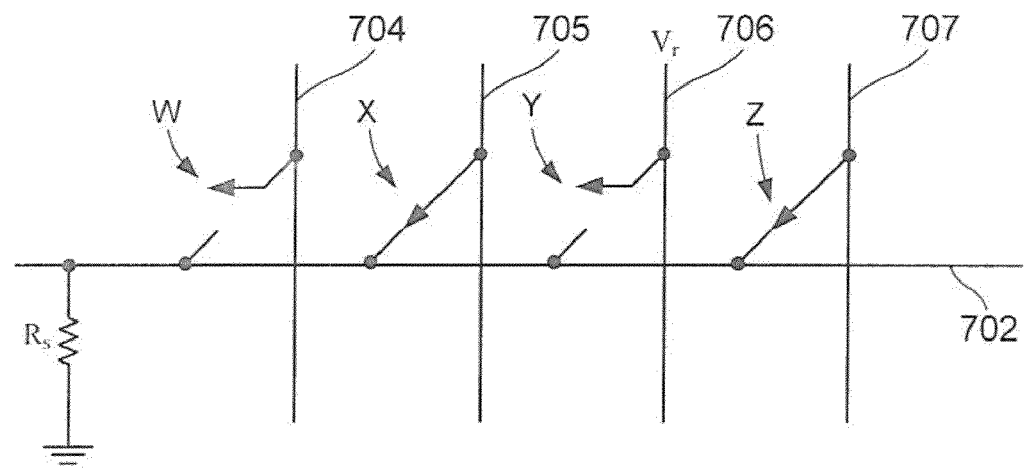

FIGS. 7A-7D illustrate four example implementations of the four primitive latch operations that represents an embodiment of the present invention. As shown in FIGS. 7A-7D, the nanowire crossbar comprises a single horizontal nanowire 802, four control nanowires 704-707, and four latches labeled W-Z. The latches can represent either GMR-based spintronic devices or TMR-based spintronic devices. The two latches W and Y are open and correspond to the logic value "0," and the two latches X and Z are closed and correspond to the logic value "1." In FIG. 7A, the "clear(Z)" operation is implemented by applying a voltage V to the control nanowire 707 while allowing the remaining control nanowires 704-706 to float. The voltage V is selected so that the resulting magnetic field causes the latch Z to switch from the logic value "1" state to the logic value "0" state while the remaining latches W-Y are unchanged, as described above with reference to FIG. 5B. In FIG. 7B, a "conditionalSet(W,Y)" operation is implemented by applying a voltage $V_r$ to the nanowire 704 and a different voltage $V_w$ to the control nanowire 706 while allowing the remaining nanowires 705 and 707 to float. The operation causes the latch Z to switch from the logic value "0" state to a logic value "1" state if, and only if, the latch W is in the logic value "0" state. The remaining latches X and Y are unchanged. In FIG. 7C, the "conditionalWrite(Y)" operation is implemented by applying a voltage $V_d$ to the horizontal nanowire 702 and a voltage $V_w$ to the control nanowire 706. The remaining nanowires 704, 705, and 707 are allowed to float. As a result, the latch Y is placed in the logic value "1" state if, and only if, the voltage $V_d$ on horizontal nanowire 702 is with a range that allows the latch Y to switch, as described above with reference to FIG. 5C. The remaining latches W, X, and Z are unchanged. Note that the "conditionalWrite" operation provides a mechanism for entering a logic value from an external sources, such as CMOS, into one of the latches. In FIG. 7D, the "read(Y)" operation is implemented by applying a voltage $V_r$ to the control nanowire 706. All the remaining nanowires 704, 705, and 707 are allowed to float. As a result, the Y latch forms a voltage divider with the pull-down resistor $R_s$. The voltage on the horizontal nanowire 702 may then be measured to determine the state of the Y latch.

The NAND gate is considered a universal gate, because a number of NAND gates can be combined in series to perform the same Boolean logic operations carried out by other logic gates. FIG. 8A shows a schematic representation of a NAND logic gate. The NAND logic symbol 802 represents a logic NAND gate operation that converts two input logic levels, represented symbolically by A 804 and B 805, into a single output logic level, represented symbolically by $\overline{AB}$ 806, which may be denoted by:

$$\text{NAND}(A,B) = \overline{AB}$$

FIG. 8B illustrates a truth table that represents possible logic inputs and corresponding logic outputs of the NAND logic gate 802. As shown in FIG. 8B, when either logic level A or B is logic value "0," the NAND logic gate outputs the logic value "1," and when both logic inputs A and B are logic value "1," the NAND logic gate outputs the logic value "0."

In general, the NAND logic gate is not limited to just two input logic levels A and B, as shown in FIGS. 8A-8B. When any one of the input logic levels is logic value "0," the NAND logic gate outputs the logic value "1," and when all of the logic inputs are logic value "1," the NAND logic gate outputs the logic value "0." FIG. 9A shows a schematic representation of a NAND logic gate that receives three inputs A, B, and C, and outputs a single logic output $\overline{ABC}$, which may also be denoted by:

$$\text{NAND}(A,B,C) = \overline{ABC}$$

FIG. 9B illustrates a truth table that represents possible logic inputs and corresponding logic outputs of the NAND logic gate shown in FIG. 9A.

Sequences of the four primitive operations can be used to implement the NAND logic gate NAND(A, B)=$\overline{AB}$. The impedance states of the latches X, Y and Z, of the nanowire crossbar, shown in FIG. 8, correspond to the logic values A, B, and $\overline{AB}$, respectively. The following sequence of primitive operations, described above with reference to FIG. 8, are carried out to implement the NAND logic gate for two logic inputs:

clear(Z);
conditionalSet(X,Z); and
conditionalSet(Y,Z).

This sequence changes the value of the latch Z and leaves the latches X and Y unchanged.

Figure 10A:
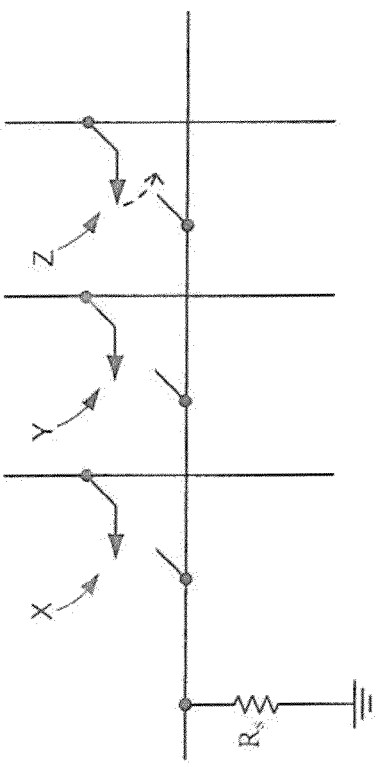
FIGS. 10A-10D illustrate four possible impedance states of latches that correspond to the four possible inputs displayed in the truth table shown in FIG. 8B that represents an embodiment of the present invention.
Figure 10B:
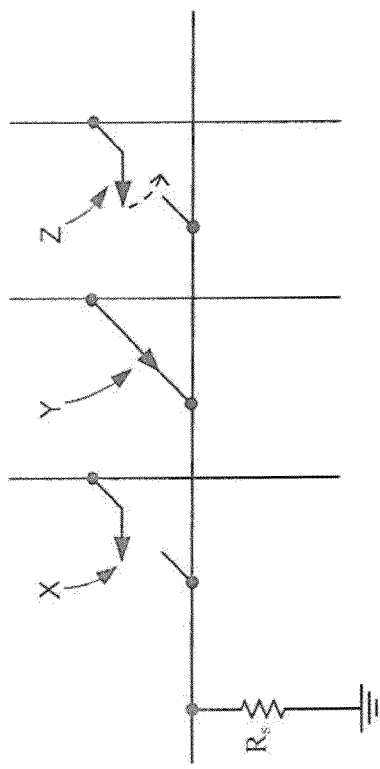
Figure 10C:
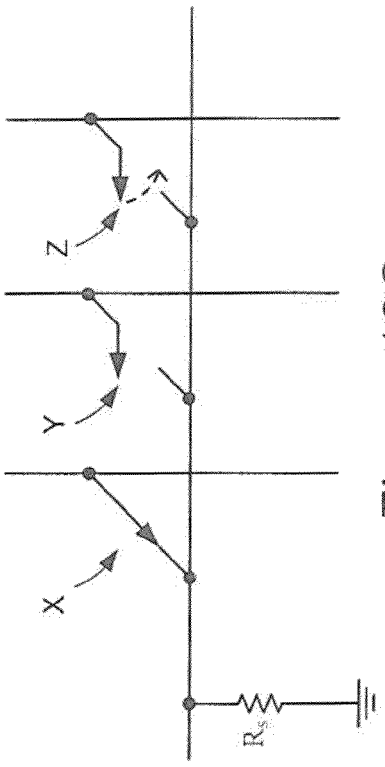
Figure 10D:
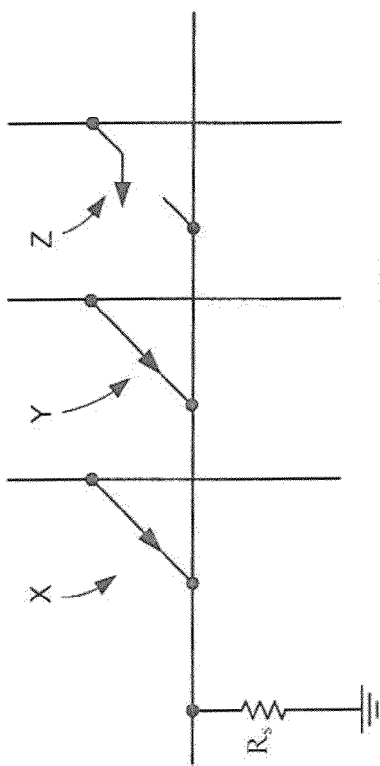

FIGS. 10A-10D illustrate the four possible impedance states of latches X and Y that correspond to the four possible inputs displayed in the truth table shown in FIG. 8B that represents an embodiment of the present invention. As shown in FIGS. 10A-10D, the Z latch is placed in a logic value "0" state and directed by the primitive "clear(Z)." Note that all other control nanowires not shown are allowed to float. FIG. 10A shows that when the latches X and Y correspond to the logic value "0" state, the latch Z is switched to the logic value "1" state, which corresponds to the gate operation NAND(0,0)=1. FIG. 10B shows that when the latch X is in a logic value "0" state, and the latch Y is in the logic value "1" state, the latch Z is switched to the logic value "1" state, which corresponds to the gate operation NAND(0,1)=1. FIG. 10C shows that when the latch X is in a logic value "1" state, and the latch Y is in the logic value "0" state, the latch Z is switched to the logic value "1" state, which corresponds to the gate operation NAND(1,0)=1. FIG. 10D shows that when the latches X and Y are in the logic value "1" state, the latch Z remains in the logic value "0" state, which corresponds to the gate operation NAND(1,1)=0.

Although the present invention has been described in terms of particular embodiments, it is not intended that the invention be limited to these embodiments. Modifications within the spirit of the invention will be apparent to those skilled in the art. In alternate embodiments of the present invention, the NAND logic sequence of primitive operations described above with reference to FIG. 10 can be expanded to implement NAND operations for any number of input logic values. For example, the following sequence of primitive operations can be used to implement NAND logic function NAND(A, B, C)=$\overline{ABC}$ using the latches W, X, Y, and Z, as shown in FIG. 8:

clear(Z);
conditionalSet(W,Z)
conditionalSet(X,Z); and
conditionalSet(Y,Z).

In alternate embodiments of the present invention, the conditionalSet primitive operation can also be used to implement a logic NOT gate. For example, the sequence of primitive operations:

clear(Z); and
conditionalSet(X,Z)

implement the logic NOT gate for the nanowire crossbars shown in FIG. 8.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. A nanowire-crossbar array comprising:
a first nanowire;
a number of substantially parallel control nanowires positioned so that each control nanowire overlaps the first nanowire;
a number of spintronic devices, each spintronic device being non-volatile and including a permanent magnetic material and a free magnetic material, each spintronic device connecting one of the control nanowires to the first nanowire and operating as a latch for controlling signal transmissions between the control nanowire and the first nanowire
a pull-down resistor coupled to the first nanowire;
a ground coupled to the pull-down resistor; and
a number of voltage sources, each voltage source coupled to one of the control nanowires.

2. The nanowire-crossbar array of claim 1 wherein the first nanowire can be time shared with an input signal and an output signal.

3. The nanowire-crossbar array of claim 1,
wherein a write voltage applied to a first control nanowire, read voltages applied to closed latch control nanowires adjacent to the first control nanowire, and a fixed voltage applied to the first nanowire changes the resistance state of the spintronic device connecting the first control nanowire to the first nanowire.

4. The nanowire crossbar array of claim 1 wherein the nanowire-crossbar array is in a non-inverting latch configuration.

5. The nanowire-crossbar array of claim 1 wherein the spintronic devices further comprise a spin valve.

6. The nanowire-crossbar array of claim 5 wherein the spin valve further comprises:
a permanent magnetic material;
a semiconductor material adjacent to the permanent magnetic material; and
a free magnetic material adjacent to the semiconductor material.

7. The nanowire-crossbar array of claim 1 wherein the signals can be one of:
voltage; or
current.

8. The nanowire-crossbar array of claim 1 wherein the spintronic device operates as a latch further comprises the latch operating in a high-impedance state or a low-impedance state.

9. The nanowire-crossbar array of claim 1 wherein spintronic devices further comprise multiple metallic layers that are operated according to a giant magnetoresistance effect.

10. The nanowire-crossbar array of claim 1 wherein the spintronic devices further comprise metal-insulator-metal junction that are operated according to a tunnel magentoresistance effect.

* * * * *

UNITED STATES PATENT AND TRADEMARK OFFICE
CERTIFICATE OF CORRECTION

PATENT NO.        : 8,143,682 B2                              Page 1 of 1
APPLICATION NO.   : 11/590959
DATED             : March 27, 2012
INVENTOR(S)       : Alexandre M. Bratkovski et al.

It is certified that error appears in the above-identified patent and that said Letters Patent is hereby corrected as shown below:

In column 10, lines 64-65, in Claim 10, delete "magentoresistance" and insert -- magnetoresistance --, therefor.

Signed and Sealed this
Eighth Day of January, 2013

David J. Kappos
*Director of the United States Patent and Trademark Office*